(12) United States Patent
Kao et al.

(10) Patent No.: US 8,110,881 B2
(45) Date of Patent: Feb. 7, 2012

(54) MRAM CELL STRUCTURE WITH A BLOCKING LAYER FOR AVOIDING SHORT CIRCUITS

(75) Inventors: Ya-Chen Kao, Hsin-Chu (TW); Chun-Jung Lin, HsinChu (TW); Yu-Jen Wang, Hsinchu (TW); Hsu-Chen Cheng, Hsinchu (TW); Feng-Jia Shiu, Hsinchu (TW); Yung-Tao Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1167 days.

(21) Appl. No.: 11/863,130

(22) Filed: Sep. 27, 2007

(65) Prior Publication Data

US 2009/0085132 A1    Apr. 2, 2009

(51) Int. Cl.
*H01L 29/82* (2006.01)

(52) U.S. Cl. ......... 257/421; 257/E21.665; 257/E29.323; 365/158

(58) Field of Classification Search .................. 257/421, 257/E21.665, E29.323; 365/158
See application file for complete search history.

(56) References Cited

U.S. PATENT DOCUMENTS 6,806,096 B1 * 10/2004 Kim et al. .......... 438/3
7,381,574 B2 * 6/2008 Kim et al. .......... 438/3

* cited by examiner

*Primary Examiner* — David Vu
*Assistant Examiner* — Brandon Fox
(74) *Attorney, Agent, or Firm* — K&L Gates LLP (57) ABSTRACT

A MRAM cell structure includes a bottom electrode; a magnetic tunnel junction unit disposed on the bottom electrode; a top electrode disposed on the magnetic tunnel junction unit; and a blocking layer disposed on the top electrode, wherein the blocking layer is wider than the magnetic tunnel junction unit for preventing against formation of a short circuit between a contact and the magnetic tunnel junction unit.

19 Claims, 7 Drawing Sheets

MRAM CELL STRUCTURE WITH A BLOCKING LAYER FOR AVOIDING SHORT CIRCUITS

BACKGROUND

The present invention relates generally to magnetoresistive random access memory (MRAM), and more particularly to a MRAM cell structure with a blocking layer for avoiding short circuits.

MRAM is a type of memory device containing an array of MRAM cells that store data using their resistance states instead of electronic charges. Each MRAM cell includes a magnetic tunnel junction (MTJ) unit whose resistance can be adjusted to represent a logic state "0" or "1." Conventionally, the MTJ unit is comprised of a fixed magnetic layer, a free magnetic layer, and a dielectric tunnel layer disposed there between. The resistance of the MTJ unit can be adjusted by changing the direction of the magnetic moment of the free magnetic layer. When the magnetic moment of the free magnetic layer is parallel to that of the fixed magnetic layer, the resistance of the MTJ unit is low, whereas when the magnetic moment of the free magnetic layer is anti-parallel to that of the fixed magnetic layer, the resistance of the MTJ unit is high. The MTJ unit is coupled between top and bottom electrodes, and an electric current flowing through it can be detected for determining its resistance, and therefore the logic state of the MRAM cell.

Figure 1:
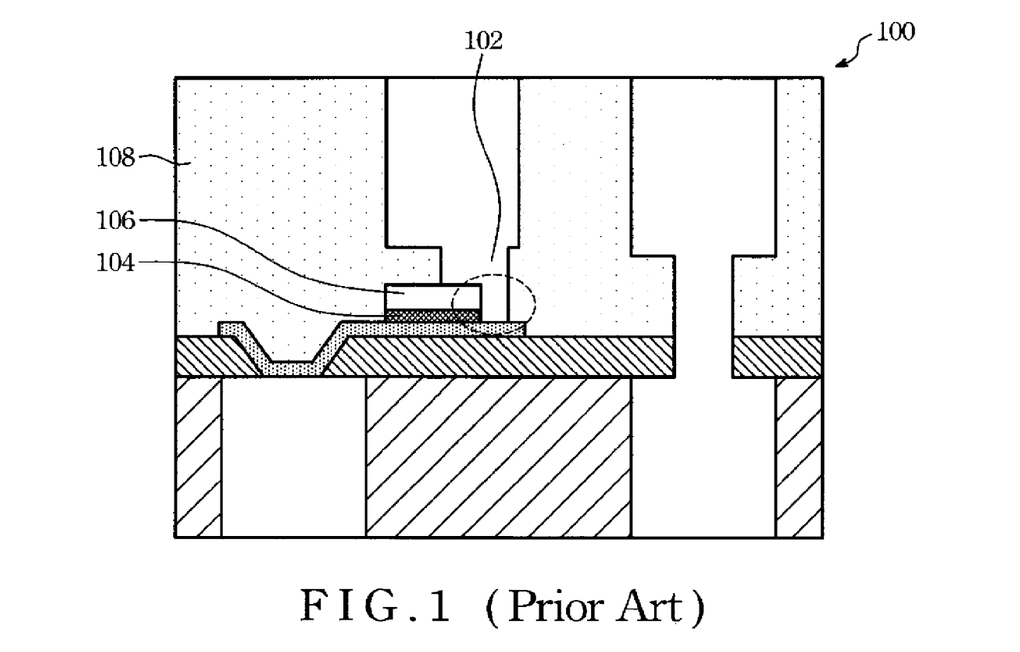
FIG. 1 illustrates a cross-sectional view of a conventional MRAM cell structure where a via contact is shorted with a MTJ unit.

One drawback of the conventional MRAM cell structure is that an undesired short circuit often occurs when forming a contact on the top electrode. For example, FIG. 1 illustrates a cross-sectional view of a conventional MRAM cell structure 100 where an undesired short circuit is formed between a via contact 102 and a MTJ unit 104. During the formation of the via contact 102, an etching process is performed to create a via on the top electrode 106 in the inter-metal dielectric layer 108, and the via is then filled with conductive materials to provide the via contact 102. As integrated circuits continue to scale down, the MRAM cells are susceptible to misalignment of the via contact 102, which increases the difficulty in controlling the end point of the via etching process, and therefore increases the possibility of a short circuit between the contact and the MTJ unit.

Figure 2:
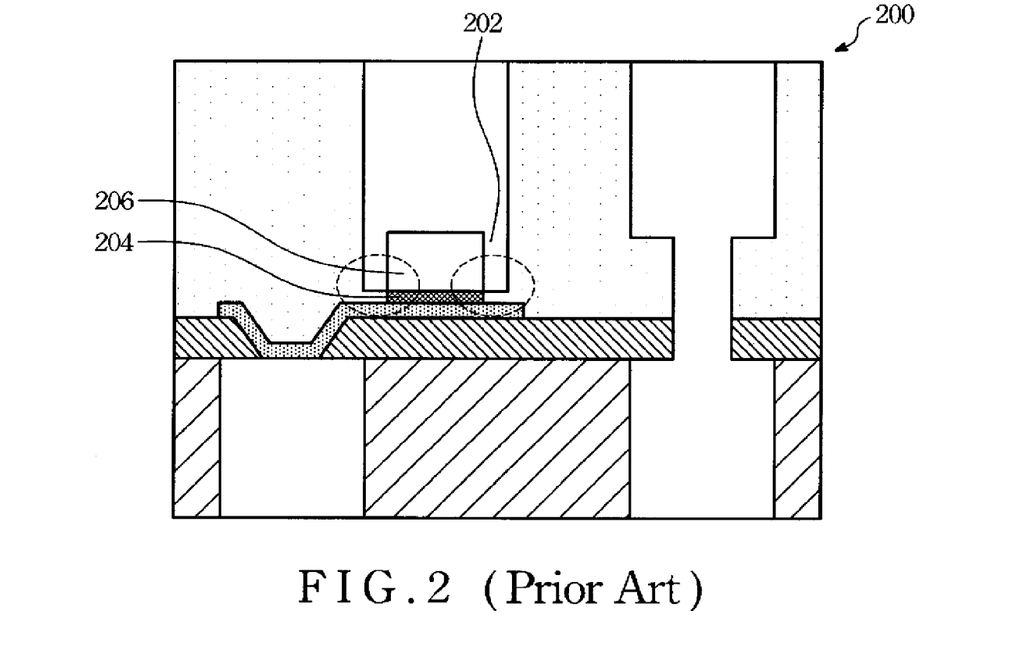
FIG. 2 illustrates a cross-sectional view of another conventional MRAM cell structure where a direct contact is shorted with a MTJ unit.

FIG. 2 illustrates a cross-sectional view of another conventional MRAM cell structure 200 where an undesired short circuit is formed between a direct contact 202 and a MTJ unit 204. Again, due to the difficulty in controlling the end point of an etching process, the front end of the direct contact 202 can extend beyond the top electrode 206 and reach the MTJ unit 204.

Such short circuits can cause the MRAM cell structures 100 and 200 to fail. Thus, what is needed is a MRAM cell structure that can avoid those undesired short circuits between the contacts and the MTJ units.

SUMMARY

The present invention discloses a MRAM cell structure with a blocking layer for avoiding short circuits. In one embodiment of the invention, the MRAM cell structure includes a bottom electrode; a magnetic tunnel junction unit disposed on the bottom electrode; a top electrode disposed on the magnetic tunnel junction unit; and a blocking layer disposed on the top electrode, wherein the blocking layer is wider than the magnetic tunnel junction unit for preventing against formation of a short circuit between a contact and the magnetic tunnel junction unit.

The construction and method of operation of the invention, however, together with additional objectives and advantages thereof will be best understood from the following description of specific embodiments when read in connection with the accompanying drawings.

DESCRIPTION

This invention describes a MRAM cell structure with a blocking layer for avoiding undesired short circuits. The following merely illustrates various embodiments of the present invention for purposes of explaining the principles thereof. It is understood that those skilled in the art will be able to devise various equivalents that, although not explicitly described herein, embody the principles of this invention.

Figure 3:
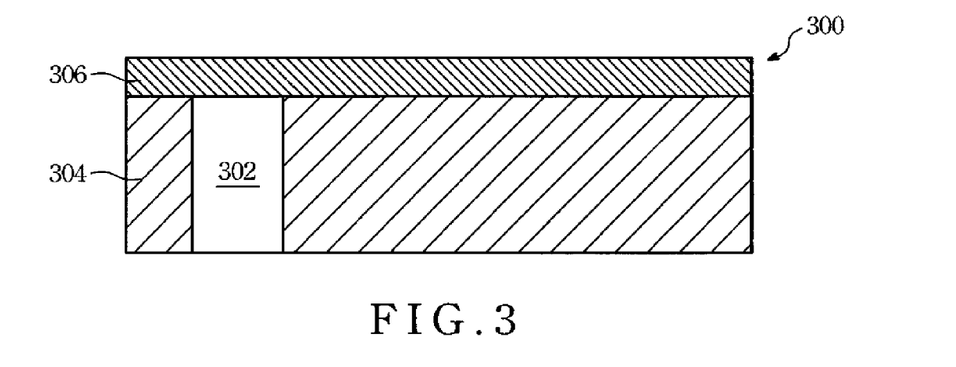
FIGS. 3-14 illustrate a series of cross-sectional views showing a process flow of fabricating a MRAM cell structure in accordance with one embodiment of the present invention.

FIGS. 3-14 illustrate a series of cross-sectional views showing a process flow of fabricating a MRAM cell structure in accordance with one embodiment of the present invention. FIG. 3 illustrates a cross-sectional view 300 where a contact 302 is constructed in a dielectric layer 304, on which another dielectric layer 306 is disposed. The dielectric layer 304 can be an inter-metal dielectric layer under which semiconductor devices, such as transistors, resistors, and diodes, are constructed on a semiconductor substrate (not shown in the figure). Those devices can be coupled to the contact 302 via embedded wiring that is not shown in the figure.

Figure 4:
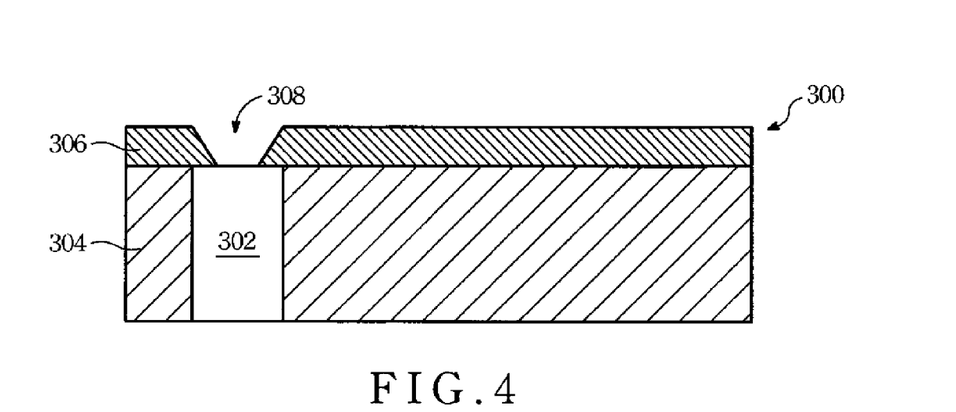
Figure 5:
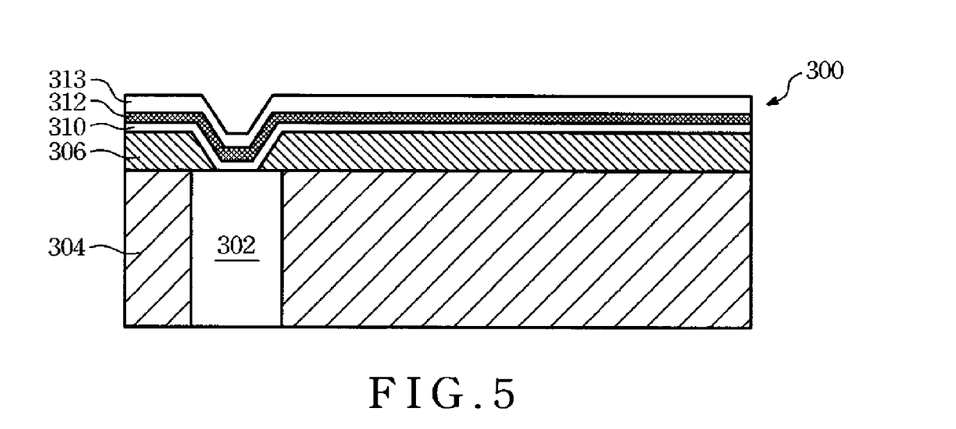

Referring to FIG. 4, an opening 308 is formed through the dielectric layer 306 to partially expose the contact 302 by a series of processing steps, such as photolithography and etching. The sidewalls of the opening 308 are tapered to a certain degree in order to facilitate depositing materials thereon in a later stage. Referring to FIG. 5, a first conductive layer 310 with a thickness ranging approximately between 100 Å and 600 Å is deposited over the dielectric layer 306 and the exposed portion of the contact 302 by methods such as chemical vapor deposition (CVD) or plasma enhanced chemical vapor deposition (PECVD). The first conductive layer 310 can be made of materials, such as copper, aluminum, and platinum. A composite MTJ layer 312 comprised of a free magnetic layer, a dielectric tunnel layer, and a fixed magnetic layer is subsequently deposited on the first conductive layer 310 by methods such as CVD or PECVD. The free and fixed magnetic layers are made of ferromagnetic materials where one is a permanent magnet set to a particular polarity, and the other's magnetic field changes to match that of an external magnetic field. The composite MTJ layer has a total thickness ranging approximately between 200 Å and 600 Å. A second conductive layer 313 with a thickness approximately ranging from 100 Å to 600 Å is deposited on the composite MTJ layer 312 by methods such as CVD and PECVD. Due to the opening 308 shown in FIG. 4, the first conductive layer 310 is electrically coupled to the contact 302, and a recess is formed on the surface of the second conductive layer 313 above the contact 302.

Figure 6:
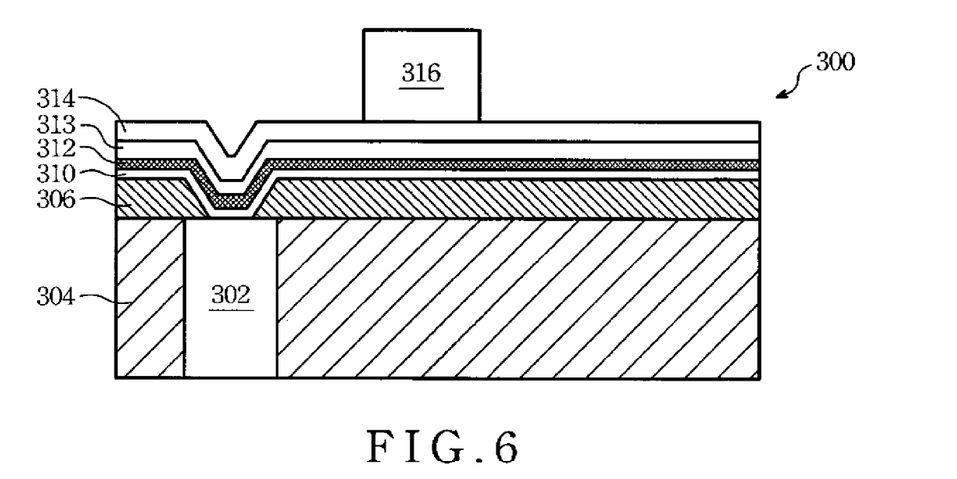

Referring to FIG. 6, a layer of bottom anti-reflecting coating (BARC) 314 is disposed on the second conductive layer 313 by methods such as spin-on coating, CVD or PECVD in order to enhance control of critical dimensions during a photolithographic process. A photoresistor layer 316 with a pattern defined by a photolithographic process is formed on the BARC 314. Parts of the BARC 314 that are not covered by the photoresistor layer 316 are etched away such that the remaining BARC 314 would have a pattern substantially identical to that of the photoresistor layer 316. Thereafter, the photoresistor 316 is stripped and the remaining BARC 314 is used as a hard mask to protect its underlying layers from being removed in a subsequent etching step that partially removes the second conductive layer 313 and the composite MTJ layer 312 until the first conductive layer 312 is exposed. Then, the reaming BARC 314 is stripped to render a semiconductor structure with a profile as the cross-sectional view shown in FIG. 7.

Figure 7:
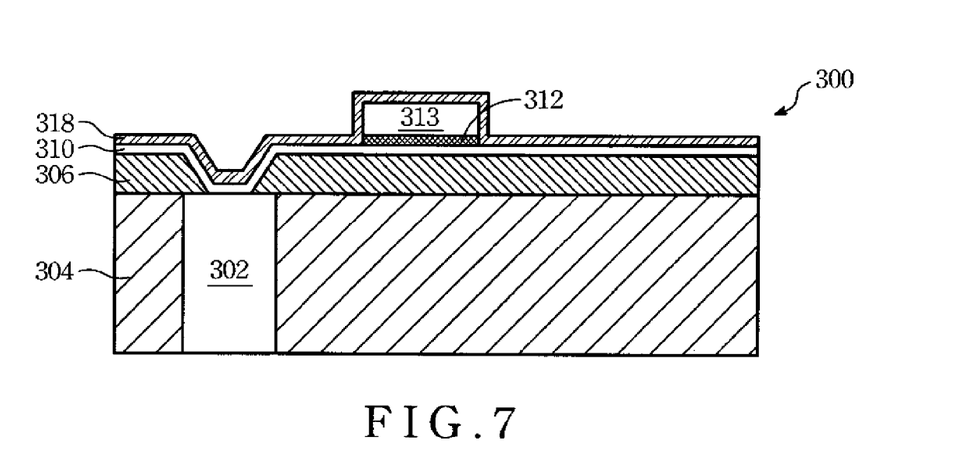

It is noted that in FIG. 7, an optional cap layer 318 is deposited over the first conductive layer, the remaining composite MTJ layer 312 and the remaining second conductive layer 313. This cap layer 318 is designed, among other things, to protect the composite MTJ layer 312 from being shorted with a contact to be constructed in a later stage. As such, it is desired that the cap layer 318 be made of dielectric materials, such as silicon oxide, silicon nitride, silicon oxynitride, and silicon carbide.

Figure 8:
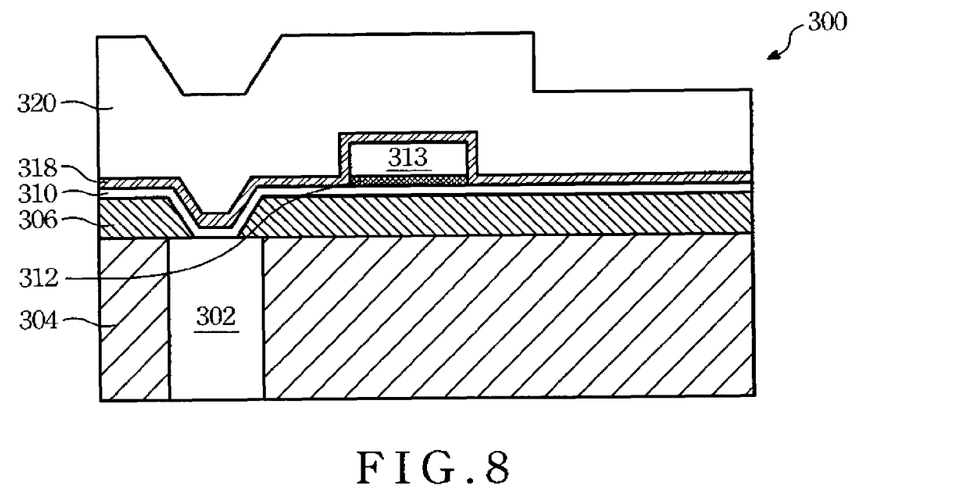
Figure 9:
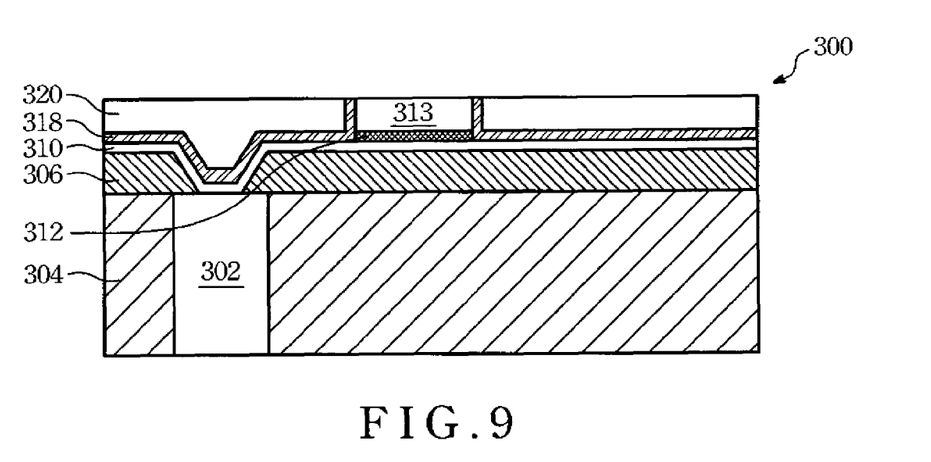

Referring to FIG. 8, an inter-metal dielectric layer 320 is deposited over the cap layer 318. The inter-metal dielectric layer 320 has a relatively uneven surface as it reflects the contour of the cap layer 318. The inter-metal dielectric layer 320 is leveled by methods such as chemical mechanical polishing (CMP) or an etching back process until the second conductive layer 313 is exposed to render a semiconductor structure with a profile as the cross-sectional view shown as FIG. 9. In FIG. 9, the optional cap layer 318 remains on the sidewalls of the second conductive layer 313 to protect the top electrode 313 from being shorted with a contact to be constructed in a later stage.

Figure 10:
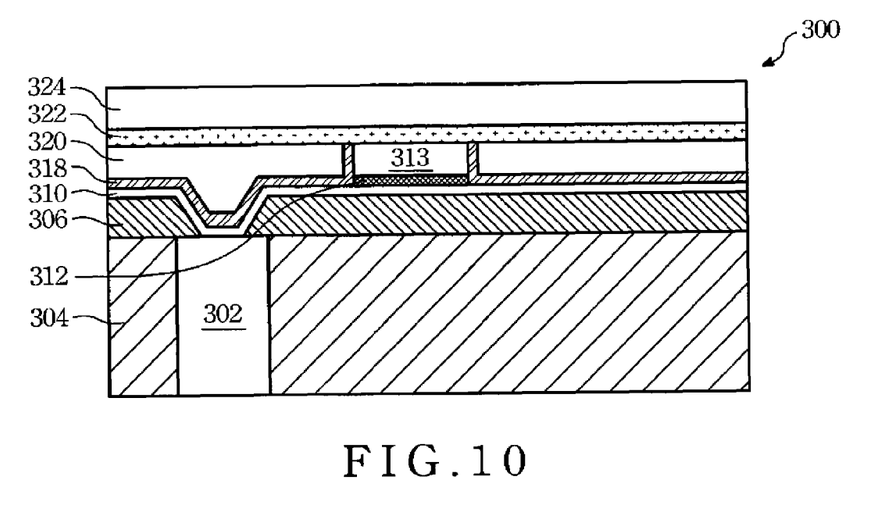
Figure 11:
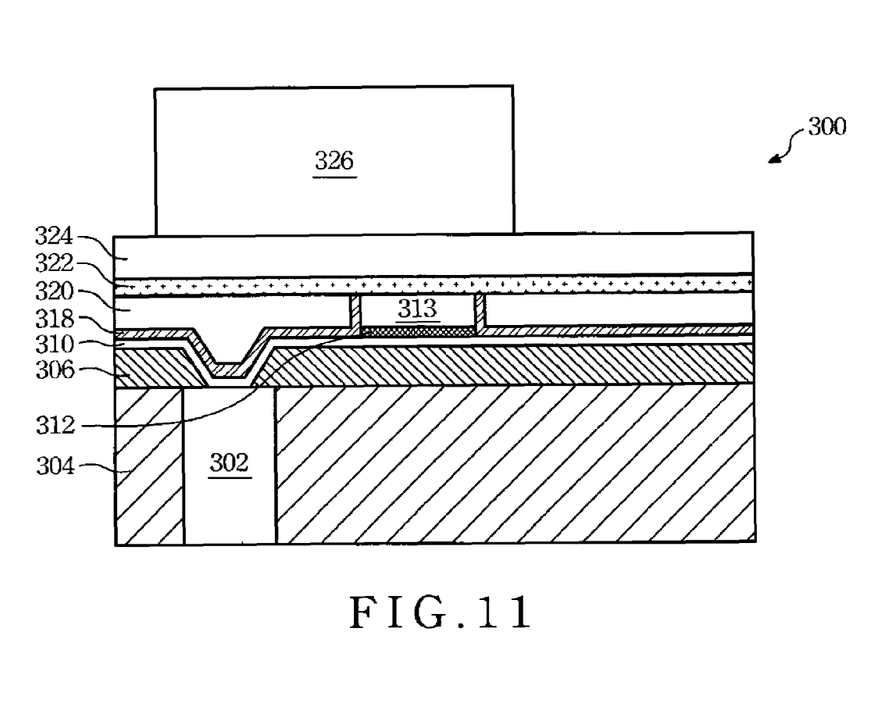

Referring to FIG. 10, a blocking layer 322 with a thickness ranging approximately between 100 Å and 600 Å is deposited over the inter-metal dielectric layer 320, the second conductive layer 313, and the cap layer 318 on the sidewalls of the second conductive layer 313. The blocking layer 318 is made of conductive materials, such as copper, aluminum, platinum, which can be the same materials making up the second conductive layer 313, to from an electrical connection with the second conductive layer 313. An optional etch stop layer 324 can be deposited on the blocking layer 322 for controlling the end point of a subsequent etch process. Referring to FIG. 11, a photoresistor layer 326 is disposed on the etch stop layer to define a MRAM cell structure. An etching process is performed to remove parts of the etch stop layer 324, the blocking layer 322, the inter-metal dielectric layer 320, the cap layer 318 and the first conductive layer 310 that are not covered by the photoresistor layer 326. Thereafter, the photoresistor layer 326 is stripped to render a semiconductor structure with a profile as the cross-sectional view shown in FIG. 12.

Figure 12:
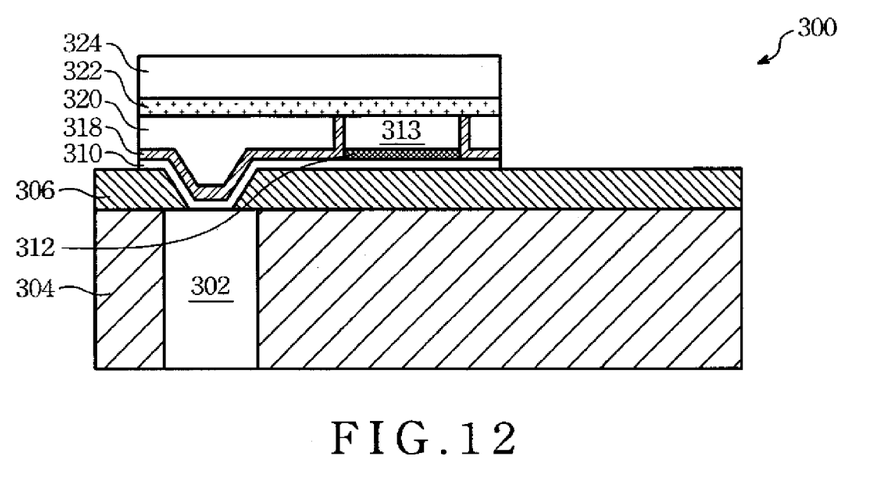
Figure 13:
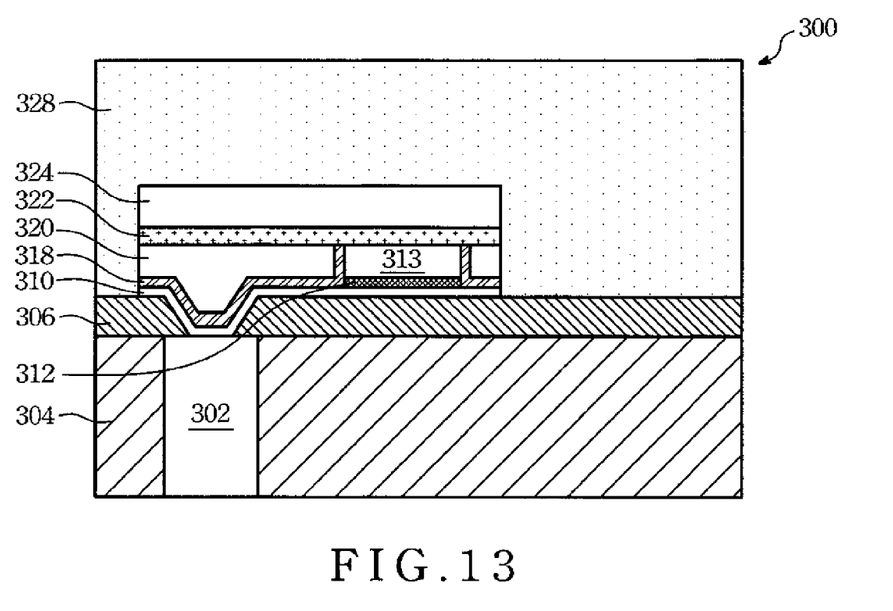

In FIG. 12, the remaining first conductive layer 310, composite MTJ layer 312 and second conductive layer 313 function as the bottom electrode, the MTJ unit and the top conductive layer 313 of a MRAM cell structure, respectively. The blocking layer 322 and the etch stop layer 324 have a width that is substantially the same as that of the bottom electrode 310 measured horizontally. An inter-metal dielectric layer 328 is deposited over the etch stop layer 324 and the exposed dielectric layer 306 to render a semiconductor structure with a profile as the cross-sectional view shown in FIG. 13.

Figure 14:
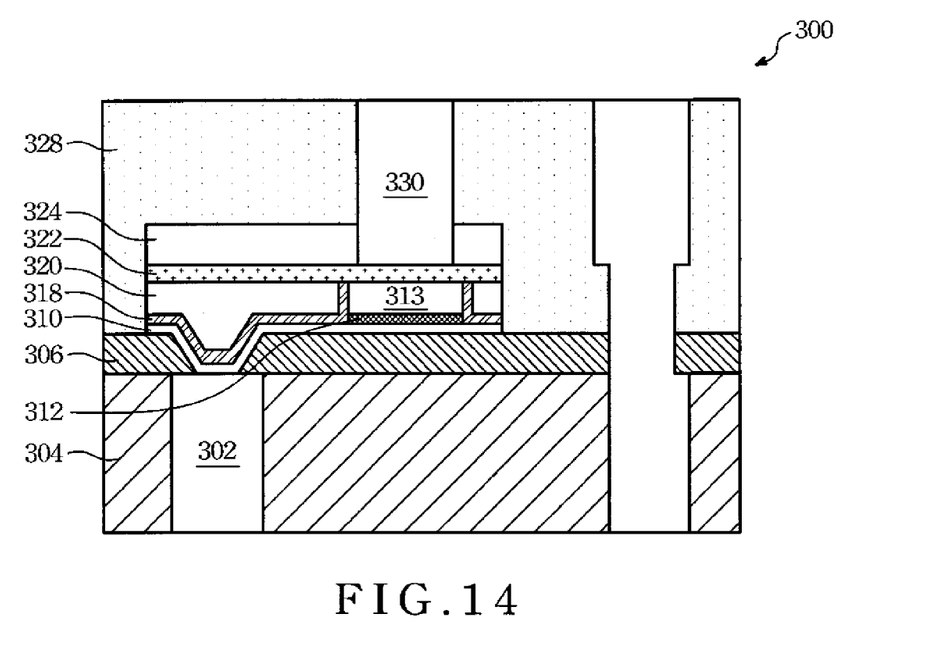

Referring to FIG. 14, a contact 330 is constructed in the inter-metal dielectric layer 328 and the etch stop layer 324 to form an electrical connection with the blocking layer 322. The contact 330 is made by forming a contact opening and then filling the opening with conductive materials by methods such CVD, PECVD, and electric plating. During operation, a voltage is applied to the top electrode 313 through the contact 330 and the blocking layer 322, resulting in a current flowing through the MTJ unit 312 that can be detected at via the contact 302 coupled to the bottom electrode 310. As discussed above, the resistance of the MTJ unit 312 can be adjusted by changing the magnetic moment of the free magnetic layer to represent a logic state, which can be read by detecting the current flowing from the contact 330 to the contact 302.

In this embodiment, the contact 330 is shown as a direct contact without any via constructed between the contact itself and the blocking layer 322. Alternatively, a via contact similar to the one shown in FIG. 1 can be constructed on the blocking layer 322 in accordance with another embodiment of the present invention.

The blocking layer 322 and the cap layer 318 on the sidewalls of the top electrode 313 protect the MTJ unit 312 from being shorted with the contact 330 caused by over etching during the formation thereof. Even if a misalignment of the contact 330 occurs, the blocking layer 322 and the cap layer 318 are able to prevent the misaligned contact from penetrating into the MTJ unit 312. As such, the reliability of the MRAM cell structure as shown in FIG. 14 can be improved.

Moreover, another advantage of the present invention is that the proposed process does not require an additional mask and is compatible with the standard backend process. Thus, the proposed MRAM cell structure would not incur a significant increase in costs.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A magnetoresistive random access memory (MRAM) cell structure comprising:
   a bottom electrode;
   a magnetic tunnel junction unit disposed on the bottom electrode;
   a top electrode disposed on the magnetic tunnel junction unit; and
   a blocking layer disposed on the top electrode, without being physically connected to a neighboring cell of the MRAM cell structure, wherein the blocking layer is wider than the magnetic tunnel junction unit for preventing against formation of a short circuit between a contact and the magnetic tunnel junction unit, and wherein the blocking layer is made of electrically conductive material, such as copper, aluminum, or platinum.

2. The MRAM cell structure of claim 1 wherein the blocking layer and the top electrode are made of the same material.

3. The MRAM cell structure of claim 1 wherein the blocking layer has a width equal to that of the bottom electrode.

4. The MRAM cell structure of claim 1 wherein the blocking layer has a thickness between 100 Å and 600 Å.

5. The MRAM cell structure of claim 1 comprising one or more cap layers constructed on sidewalls of the top electrode.

6. The MRAM cell structure of claim 1 comprising an etch stop layer on the blocking layer.

7. The MRAM cell structure of claim 6 wherein the etch stop layer has a width equal to that of the blocking layer.

8. The MRAM cell structure of claim 1 wherein the contact is a via contact.

9. The MRAM cell structure of claim 1 wherein the contact is a direct contact.

10. A magnetoresistive random access memory (MRAM) cell structure comprising:
    a bottom electrode;
    a magnetic tunnel junction unit disposed on the bottom electrode;
    a top electrode disposed on the magnetic tunnel junction unit; and
    a blocking layer disposed on the top electrode, without being physically connected to a neighboring cell of the MRAM cell structure,
    wherein the blocking layer is wider than the magnetic tunnel junction unit for preventing against formation of a short circuit between a contact and the magnetic tunnel junction unit, and has a width equal to that of the bottom electrode.

11. The MRAM cell structure of claim 10 wherein the blocking layer and the top electrode are made of the same material.

12. The MRAM cell structure of claim 10 wherein the blocking layer has a thickness between 100 Å and 600 Å.

13. The MRAM cell structure of claim 10 comprising one or more cap layers constructed on sidewalls of the top electrode.

14. The MRAM cell structure of claim 10 comprising an etch stop layer on the blocking layer.

15. The MRAM cell structure of claim 14 wherein the etch stop layer has a width equal to that of the blocking layer.

16. A magnetoresistive random access memory (MRAM) cell structure comprising:
    a bottom electrode;
    a magnetic tunnel junction unit disposed on the bottom electrode;
    a top electrode disposed on the magnetic tunnel junction unit;
    a blocking layer disposed on the top electrode, without being physically connected to a neighboring cell of the MRAM cell structure, wherein the blocking layer is wider than the magnetic tunnel junction unit for preventing against formation of a short circuit between a contact and the magnetic tunnel junction unit, and has a width equal to that of the bottom electrode; and
    an etch stop layer on the blocking layer, wherein the etch stop layer has a width equal to that of the blocking layer.

17. The MRAM cell structure of claim 16 wherein the blocking layer and the top electrode are made of the same material.

18. The MRAM cell structure of claim 16 wherein the blocking layer has a thickness between 100 Å and 600 Å.

19. The MRAM cell structure of claim 16 comprising one or more cap layers constructed on sidewalls of the top electrode.

* * * * *